(12) United States Patent
Lippincott et al.

(10) Patent No.: US 6,574,784 B1
(45) Date of Patent: Jun. 3, 2003

(54) SHORT EDGE MANAGEMENT IN RULE BASED OPC

(76) Inventors: George P. Lippincott, 16711 Gary La., Lake Oswego, OR (US) 97034; Kyohei Sakajiri, 2129 SW. Harbor Pl., Portland, OR (US) 97201; Laurence W. Grodd, 3746 SE. Yamhill, Portland, OR (US) 97214

( * ) Notice: Subject to any disclaimer, the term of this patent is extended or adjusted under 35 U.S.C. 154(b) by 11 days.

(21) Appl. No.: 09/882,802

(22) Filed: Jun. 14, 2001

(51) Int. Cl.⁷ .................................................. G06F 9/45
(52) U.S. Cl. ................................... 716/8; 716/5; 716/9
(58) Field of Search ..................... 716/8, 5, 9

(56) References Cited

U.S. PATENT DOCUMENTS

| 5,723,233 | A | | 3/1998 | Garza et al. |
| 6,453,452 | B1 | * | 9/2002 | Chang et al. .................. 716/8 |
| 6,453,457 | B1 | * | 9/2002 | Pierrat et al. ................. 716/19 |

* cited by examiner

*Primary Examiner*—Huan Hoang

(57) ABSTRACT

The invention discloses a method and apparatus for modifying, as appropriate, the geometries of a polygon. Based on various attributes associated with the polygon and its surroundings, modification of the location of the edge segments may conditionally occur. Additionally, if these modifications occur, a method to minimize the introduction of short edges during the modification is provided.

15 Claims, 18 Drawing Sheets

For each edge in layer
    If ((space to next object <= 0.2) AND (width of polygon >= 0.3)) then
        bias width -0.03
    else if ((space to next object <= 0.2) AND (0.2 <= width of polygon < 0.3)) then
        bias width -0.01
    else if ((space to next object <= 0.2) AND (width of polygon < 0.2)) then
        bias width 0.00
    else if ((0.2 < space to next object <= 0.4) AND (width of polygon >= 0.3)) then
        bias width -0.01
    else if ((0.2 < space to next object <= 0.4) AND (0.2 <= width of polygon < 0.3)) then
        bias width 0.01
    else if ((0.2 < space to next object <= 0.4) AND (width of polygon < 0.2)) then
        bias width 0.03
    else if ((0.4 < space to next object <= 0.7) AND (width of polygon >= 0.3)) then
        bias width 0.01
    else if ((0.4 < space to next object <= 0.7) AND (0.2 <= width of polygon < 0.3)) then
        bias width 0.03
    else if ((0.4 < space to next object <= 0.7) AND (width of polygon < 0.2)) then
        bias width 0.04
    else if ((space to next object > 0.7) AND (width of polygon >= 0.3)) then
        bias width 0.02
    else if ((space to next object > 0.7) AND (0.2 <= width of polygon < 0.3)) then
        bias width 0.04
    else if ((space to next object > 0.7) AND (width of polygon < 0.2)) then
        bias width 0.05
end for each

Figure 4

|  | If spacing: | and width: | and length: | then bias is: |
|---|---|---|---|---|
|  | sp > 0.9 | w < 0.2 | l => 0.3 | 0.5 |
|  | sp > 0.9 | 0.2 <= w <0.3 | l => 0.3 | 0.4 |
| 1010 | sp > 0.9 | 0.3 <= w <0.5 | l => 0.3 | 0.2 |
|  | . |  |  |  |
|  | . |  |  |  |
|  | . |  |  |  |
|  | sp > 0.9 | 0.2 <= w <0.3 | l < 0.3 | 0.0 |
| 1020 | sp > 0.9 | 0.3 <= w <0.5 | l < 0.3 | 0.0 |
|  | . |  |  |  |
|  | . |  |  |  |
|  | . |  |  |  |

Figure 10

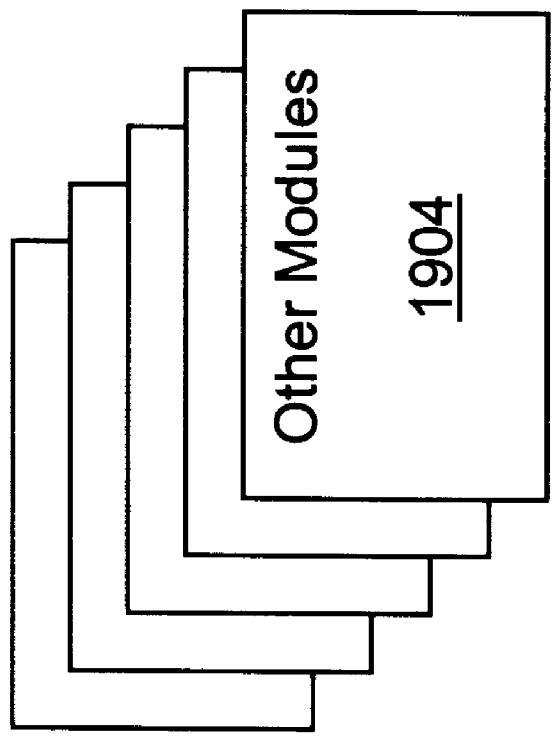
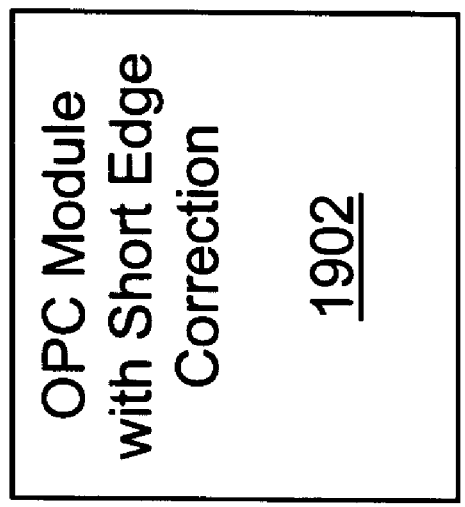
Figure 19

SHORT EDGE MANAGEMENT IN RULE BASED OPC

FIELD OF THE INVENTION

The present invention relates to the field of electronic design automation software. More specifically, the invention relates to the automatic adjustment of layout of integrated circuit designs.

BACKGROUND OF THE INVENTION

To be able to continually increase the gate count of semiconductor devices on fixed die size, integrated circuit (IC) designs have involved shrinking feature sizes. For the next decade, the outlook is strong for photolithography to continue to be the process by which IC are manufactured. When processing the features in today's deep sub-micron processes, the wavelength of light used in the photolithography process is less than that of the feature size. A result of the use of photolithography under these "tight" conditions is that the resulting design, notwithstanding the use of phase shift masking, does not precisely match the desired design.

A method of automatically correcting the resulting differences involves making subtle modifications to the mask or reticle used in the photolithography process (hereinafter collectively referred to as mask). These modifications are termed optical proximity corrections or optical and process corrections. Whether the term is referring to optical distortions alone or for process distortions in addition to optical distortions determines which term is the proper term to use. Regardless of the reason for these corrections, the discussions herein will generically refer to either or both of these types of corrections as OPC.

There are two basic types of OPC, rule-based and model-based. Rule based OPC applies corrections to the mask based on a predetermined set of rules. Thus, if an analysis of the mask determines that the mask meets a predetermined set of conditions, a process applies the appropriate correction to the mask for the conditions met. The corrections resulting from the rule-based approaches are typically less accurate, when compared to model based correction. However, rule-based corrections are more computationally efficient, and less costly. In contrast, a model-based OPC technique uses process simulation to determine corrections to the masks. The model-based OPC corrections, generated in accordance with the results of these simulations, generally provide for greater accuracy than the corrections provided by rule-based OPC. However, model-based OPC is computationally intensive and therefore time consuming as well as costly.

SUMMARY OF THE INVENTION

The invention discloses a method and apparatus for modifying, as appropriate, the geometries of a polygon. Based on various attributes associated with the polygon and its surroundings, modification of the location of the edge segments may conditionally occur. Additionally, if these modifications occur, a method to minimize the introduction of short edges during the modification is provided.

In one embodiment of the present invention, if the spacing between an edge segment and the nearest feature outside of a polygon comprising the edge segment is below a certain threshold, the edge segment will be negatively biased.

In one embodiment of the present invention, if the length of an edge segment, as a result of biasing, is too short as compared to a reference value, the edge will be lengthened by shortening adjacent edge segments and lengthening the short edge segment.

BRIEF DESCRIPTION OF THE DRAWINGS

FIG. 4—A more complex correction based on additional dimensions.

FIG. 10—A 3-dimentional table applied to the polygon of FIG. 6 establishing the bias shown in FIG. 8.

FIG. 19—An Electronic Design Automation (EDA) Tool Suite incoporated with the teachings of the present invention.

DETAILED DESCRIPTION OF THE INVENTION

In the following description, various aspects of the present invention will be described. For purposes of explanation specific numbers, materials and configurations are set forth in order to provide a thorough understanding of the present invention. In some instances, well-known features are omitted or simplified in order not to obscure the present invention.

Various operations will be described as multiple discrete steps, in a manner that is most helpful in understanding the present invention, however, the order of description should not be construed as to imply that these operations are necessarily order dependent. In particular, these operations need not be performed in the order of presentation. Further, the description repeatedly uses the phrase "in one embodiment", which ordinarily does not refer to the same embodiment, although it may.

Width and Space Based OPC

Figure 1:
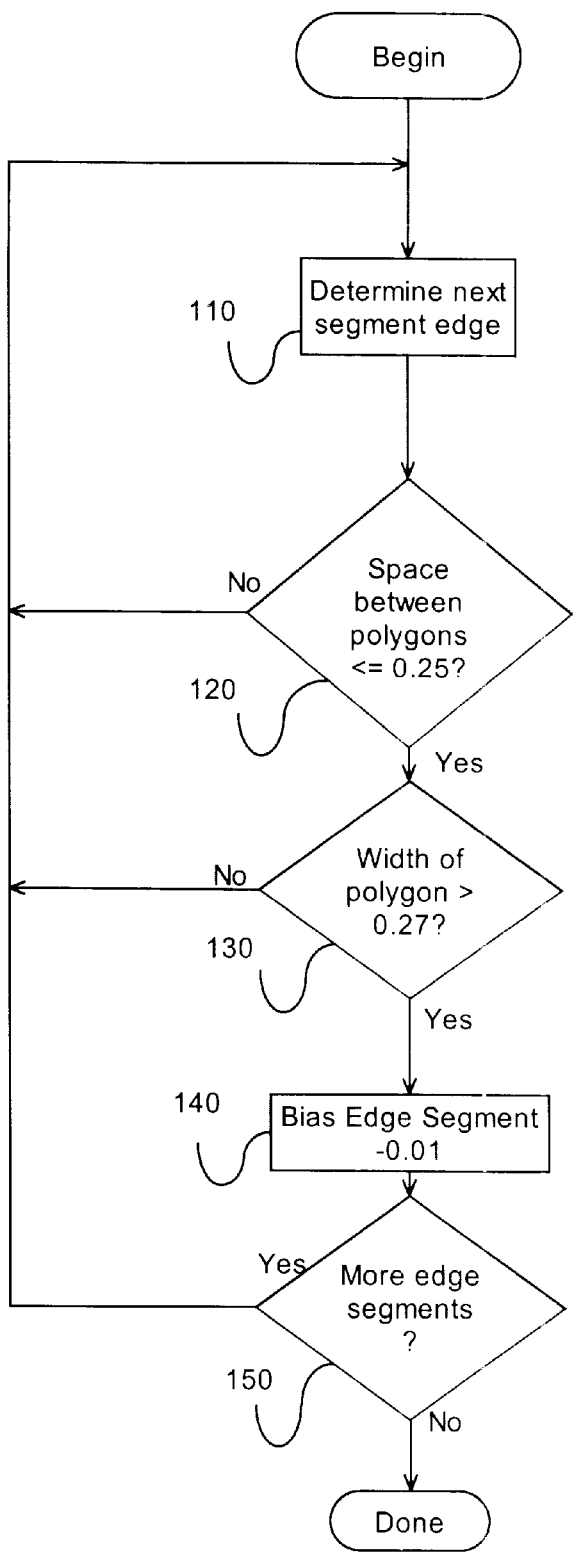
FIG. 1—A flowchart of process flow of one embodiment of the present invention.

FIG. 1 shows a flowchart of a layout correction process in accordance with one embodiment of the present invention. This flowchart depicts a process for applying rules that advantageously determine whether to apply a correction to an edge segment corresponding to a portion of a line segment defining a side of a polygon. This polygon typically represents a feature on a layer of a design of an integrated circuit. The rules are based on the width of the polygon at the portion of the edge segment and the spacing between the portion of the edge segment of the polygon and the nearest structure. FIG. 3 shows the resulting polygons with at least one edge segment of Poly1 modified when the process of FIG. 1 is applied to the polygon structure of FIG. 2.

In this embodiment of the invention, each side of each polygon in a layer is processed. Each side of a polygon is processed as a line segment, and each line segment of a polygon is further divided into one or more edge segments 110. Thus, an edge segment is at least a portion of a line segment (or side) of a polygon. Various embodiments of the invention determine which portion of the line segment defines an edge segment.

In one embodiment of the invention, the method ascertains which portion of a line segment defines an edge segment by determining at least two attribute sets along the line segment. The first attribute set is the spacing distances between the various portions of the line segment and their corresponding closest neighboring structures outside the polygon. The second attribute set is the widths of the polygon for the various portions of the line segment. That is, the distance from the various portions of the line segment to corresponding portions of a line segment or segments on the opposite side of the polygon. An edge segment will be a contiguous portion of the line segment where each of these two attributes remains constant. In other words, when continuing on the line segment, if either the width of the polygon or the spacing between the polygon and another outside structure changes, then this signals the beginning of a new edge segment.

Figure 2:
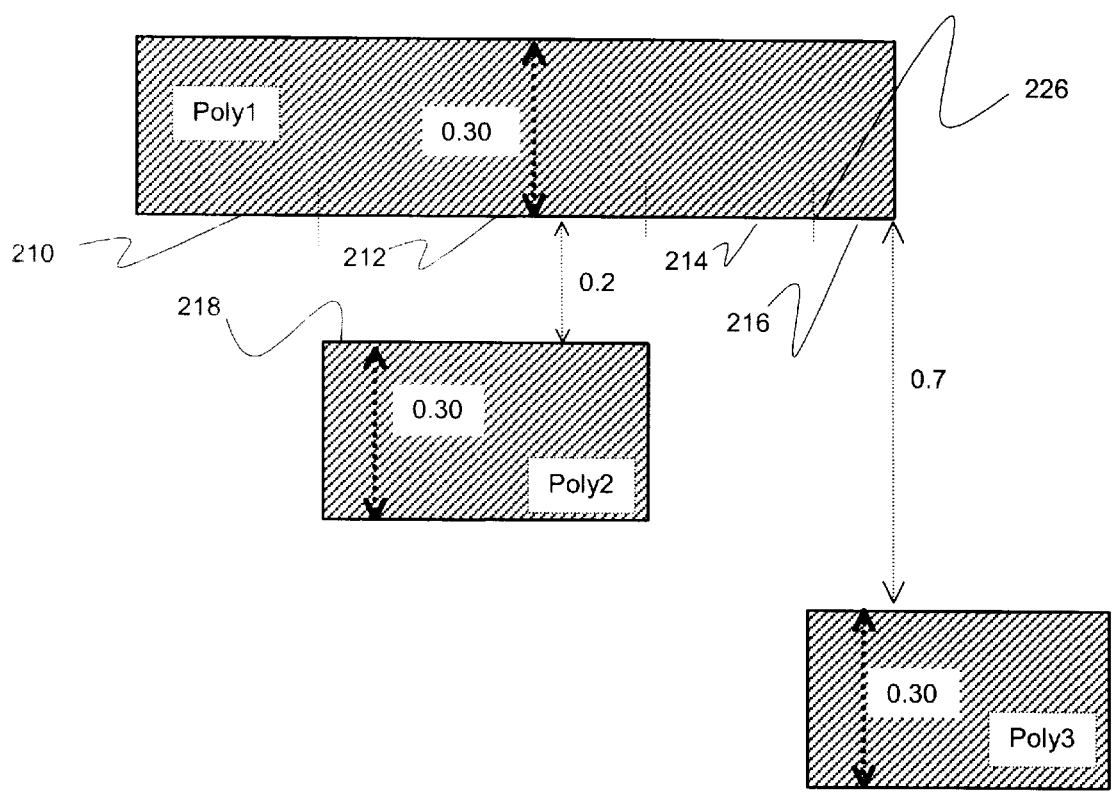
FIG. 2—A sample polygon layer to which the flowchart of the embodiment of FIG. 1 is applied.
Figure 3:
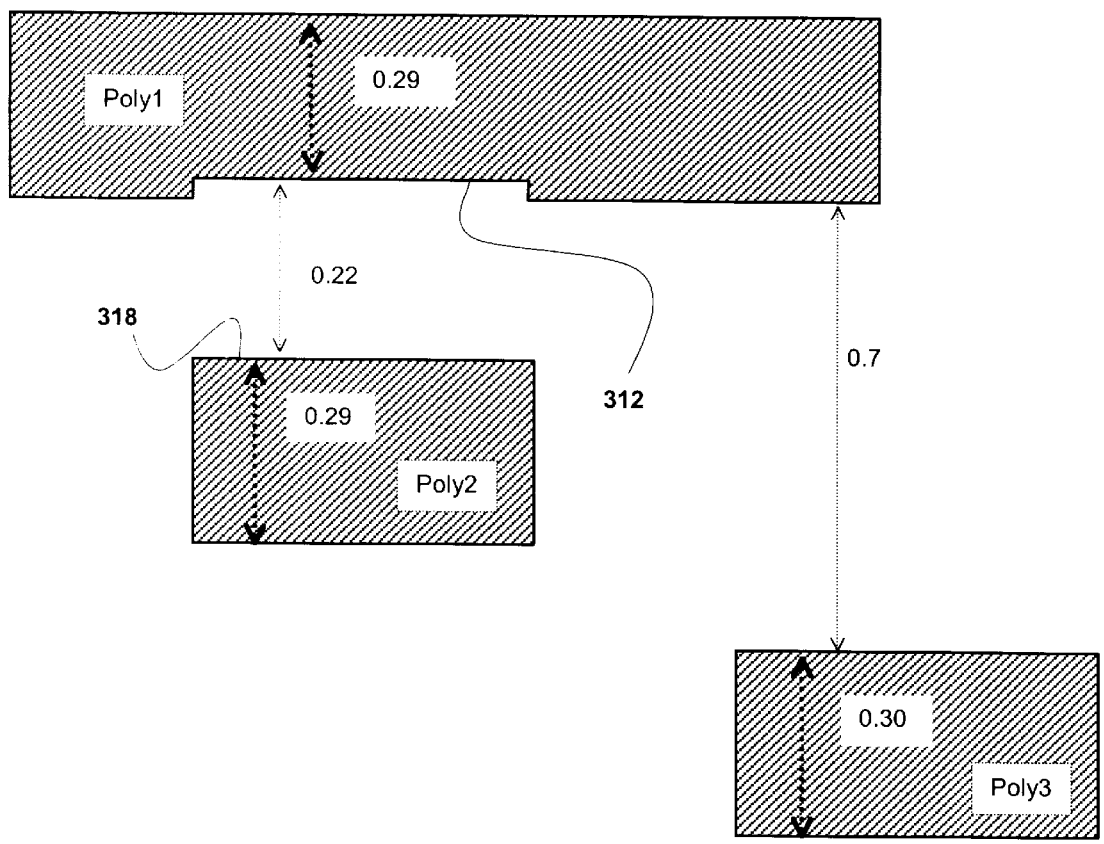
FIG. 3—A resulting polygon layer from the application of the process embodiment of the FIG. 1 to the sample polygon layer of FIG. 2.

FIG. 2 shows an example of dividing a side, or line segment, of a polygon into edge segments. The "bottom" side of Poly1 is divided by the present embodiment of the invention into the four edge segments as shown, edge segments 210–216 in FIG. 2. In this example, the width of Poly1 is constant (0.30) so any division of the bottom edge of Poly1 is made based on spacing between the various portions of the line segment and the corresponding nearest neighboring outside structures. Beginning at the bottom right corner, the spacing between Poly1 and the next structure, Poly3, is 0.7. In determining the edge segment definition, one continues along the bottom edge until either the space or the width attribute changes. In this example, this condition occurs at point 226. The portion of the edge from the corner to this point 226 defines edge segment 216. Continuation of this process for the remaining portions of the bottom edge of Poly1 results in the definition of edge segments 210–216.

In this embodiment of the present invention, during processing of an edge segment, the spacing between the edge segment and an outside nearest neighboring structure of the polygon, with respect to the edge segment currently being processed, is compared to a reference value 120. In the example shown in FIG. 1, the reference value is 0.25 units.

If the spacing is not below the reference value of this embodiment, then the process does not modify the edge segment, and the next edge segment is processed. If however, the spacing is less than the reference value, in this case 0.25, the process further checks the width of the polygon along the edge segment currently being processed. If the width of that polygon is above a certain reference value, in this case 0.27, then the process reduces the width of the polygon at the edge segment by 0.01 units. This reduction in the width is phrased as a negative bias, whereas an increase in the width of a polygon is phrased as a positive bias.

As previously mentioned, the application of the process in FIG. 1 to the polygon structures of FIG. 2 results in the modified polygon structures shown in FIG. 3. In processing the polygon structure of FIG. 2, pursuant to the process of FIG. 1, only edge segments 218 and 212 result in affirmative responses to queries 120 and 130 of FIG. 1. As a result, these are the only two edge segments which have biases correspondingly applied to them. In each case, the bias applied is a −0.01, and the resulting edge segments are shown in FIG. 3. The width of Poly1 at edge segment 312 is reduced to 0.29. Similarly, the width of edge segment 318 in Poly2 is also reduced to 0.29.

In one embodiment, the processing and the bias applications are algorithmically effectuated, whereas in another embodiment, a table is preferentially employed.

Figure 5:
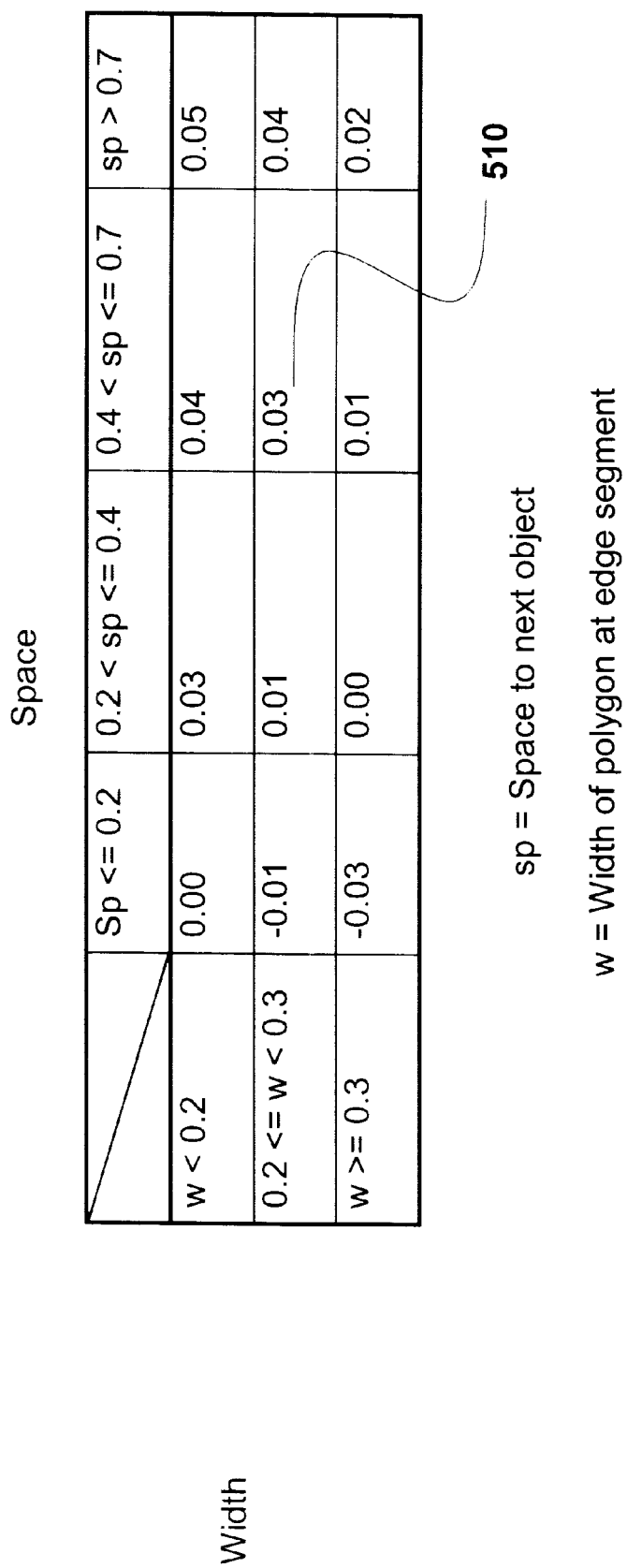
FIG. 5—A table approach to correction of edge placement.

FIG. 4 shows an example pseudocode for the handling of edge segments of a layer based on a slightly more complicated scheme than that shown above. The bias to an edge segment, as shown in FIG. 4, varies greatly in this embodiment of the present invention. In an alternate embodiment, a table that parallels the values of the algorithm is employed instead, as shown in FIG. 5. In one embodiment of the present invention, the table is implemented via an array data structure. In another embodiment of the present invention, the table is implemented via a hash table and supporting functions.

By utilizing a table-based approach, each edge segment can be bucketized. That is, each edge segment can be placed in a bucket that corresponds to a unique cell entry in a table. Thus each bucket may have any number of edge segments that have attributes that match the requirements of each cell. For example, using the embodiment shown in FIG. 5, all edges with (0.4<spacing<=0.7) and (0.2<=width<0.3) will fall into a bucket corresponding to cell 510. Thus, in one embodiment of the present invention, as the edges are processed by the present invention, when it is determined that an edge's bias should be changed, it is merely moved to a different bucket. In this manner, the edges are not immediately biased, the biases are performed at the end of the processing of the determination of each bias. This approach advantageously reduces the processing time vis-á-vis an embodiment where each edge is biased as the appropriate biased is determined.

Figure 6:
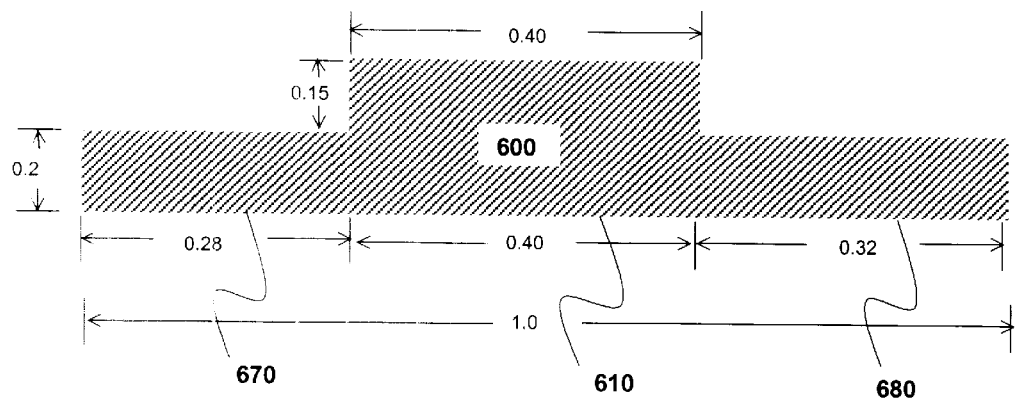
FIG. 6—A polygon with no correction.

Additional Dimension OPC Approach

Where more granularity of edge segment adjustment is needed vis-á-vis a two-dimensional approach, embodiments of the present invention may employ other dimensions, in addition to width and spacing, in determining the appropriate bias values. In one embodiment of the present invention, the length of the polygon at the edge segment undergoing processing is also used to determine the proper bias value. The length of the polygon in such an embodiment is the same as the length of the edge segment. For example, FIG. 6 shows a polygon with eight sides. Each side comprises a single edge segment except the bottom side whose length is 1.0 but which is comprised of 3 edge segments 670, 610, 680, of 0.28, 0.40 and 0.32 length, respectively. Thus, in this embodiment, when processing the three edge segments, these individual lengths of the polygon at the edge segment only will be used in determining the OPC bias value vis-à-vis the length of the entire side.

Figure 7:
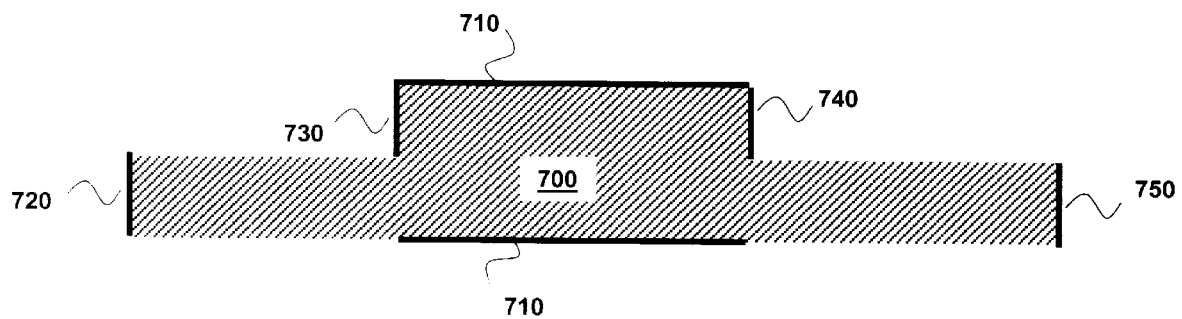
FIG. 7—The polygon of FIG. 6 with 2-dimensional bias correction applied.
Figures 8, 9:
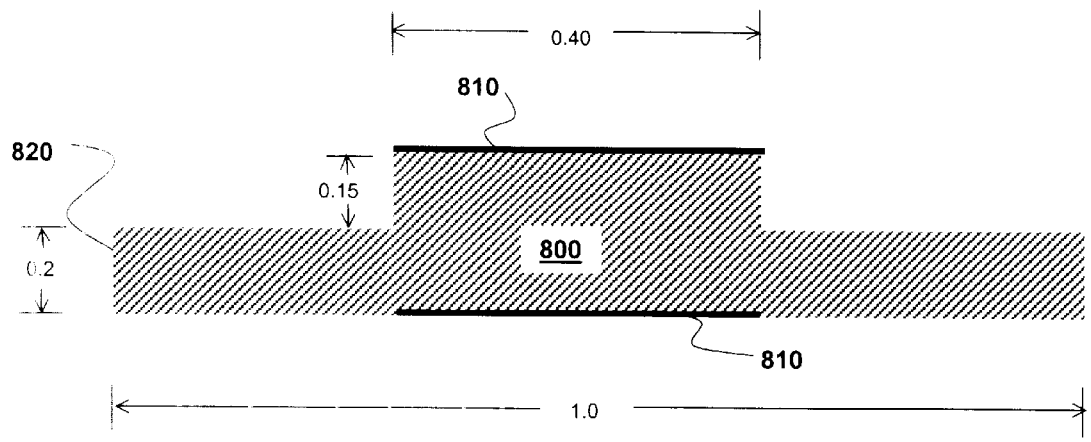
FIG. 8—The polygon of FIG. 7 with 3-dimensional bias correction applied.
FIG. 9—The 2-dimentional table applied to the polygon of FIG. 6 establishing the bias shown in FIG. 7.

FIG. 9 shows a table which applies a bias to edge segments based on two attributes of the edge segment, the width of the polygon at the edge segment and the distance of the edge segment from the nearest neighboring structure outside the polygon. Assuming the nearest neighboring structure to the edge segment of the polygon in FIG. 6 is greater than 0.7, FIG. 7 shows a resulting polygon with edge segments of FIG. 6 biased via the bias values as set out in the table of FIG. 9. The two 710 edge segments are biased for a positive 0.02 units based on the proper determination from table of FIG. 9. Note that other edge segments 720–750 on the polygon are biased by the same amount by applying the two-dimensional bias rules. The biasing that occurs is performed with respect to the width of the polygon and the spacing to the nearest neighboring structure outside the polygon. The biasing does not account for any extra dimensions such as length of the edge segment being processed by the present embodiment.

FIG. 8 shows the polygon from FIG. 6 biased via another embodiment of the present invention. This embodiment of the invention uses an additional dimension of length to ascertain the correct bias value. FIG. 10 shows a portion of a table used to determine the proper biases for this embodiment. Refer now to edge segment 820 in FIG. 8. The width measurement for this edge segment, as shown in FIG. 8, is 1.0 and the length measurement for this segment is 0.2. Note in the table in FIG. 10 at row 1020, that when the length value is less than 0.3, the bias value is to be 0.0. For edge segments 810, the length of these edge segments is 0.4, with the width being 0.35. As a result, these edge segments will be biased by 0.2 as detailed in the table in FIG. 10 at row 1010. The resultant polygon structures are shown in FIG. 8.

Figure 11:
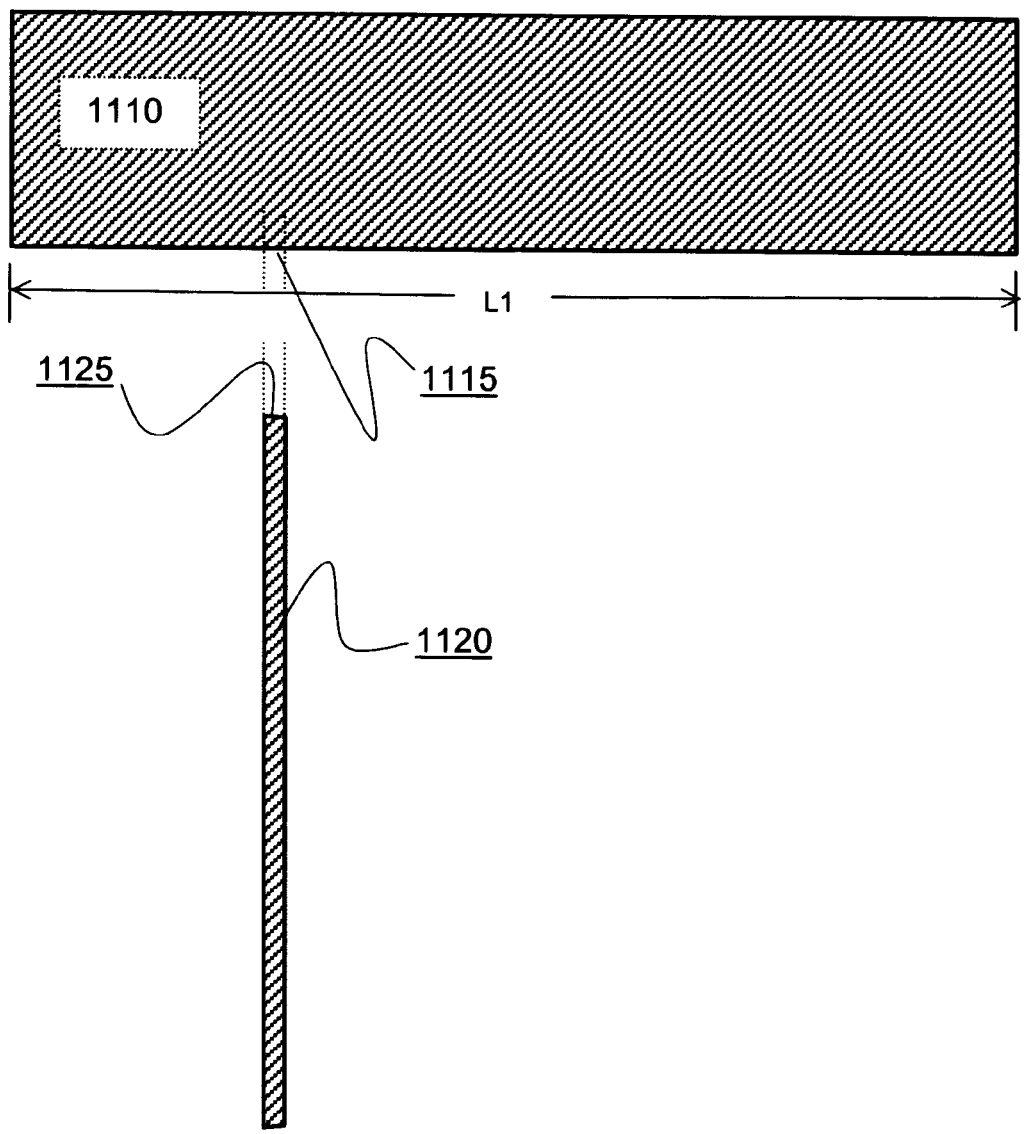

Another embodiment of the present invention takes into account a second length value in determining bias for edge segments. FIG. 11 shows another set of polygons. A first polygon 1110 has an edge with a relatively long length L1. A second polygon 1120 has an edge with a relatively short length L2 1125 below some reference length Lref (not shown). In this embodiment of the invention a user specifies a second length such that when an edge segment of a layer under consideration for biasing 1115 is referencing another polygon with an reference edge 1125 whose length is below a minimum reference length Lref, then no biasing of the edge segment under consideration will occur. This may be desirable where users do not want narrow line-end edges to be used for determining the spacing measurements. In another embodiment of the invention, the edge segment under consideration for biasing 1115 is still biased, notwithstanding the proximity of the short edge, but the bias value is attenuated as a function of the length of the second edge segment 1125.

Short Edge Interdiction

When performing biasing as discussed above, it is likely that different edge segments may be biased by different values. This can result in original (input) edge segments that are sub divided into smaller edge segments. This may result in (1) additional edge segments that (2) may be smaller than a threshold value. If each additional edge segment is sufficiently long so that there is not a problem with the manufacturability of those edges, then it may not be necessary to attempt to rid the design of those additional edges.

However there are times when making adjacent edge biases the same is desired. This would occur when the introduction of new edge segments results in edge segments below a threshold value. By having edge segments below a certain value there may be effects on design rules for the given manufacturing process.

An aspect of the invention is the ability to not allow short edges below a certain threshold. The present invention can accomplish this by resolving inconsistent biases under certain circumstances. In one embodiment of the present invention, the inconsistent biases are resolved when one edge segment is below a user specified value. In one embodiment, the inconsistent biases are resolved when one edge is below a process specific threshold value. In one embodiment all inconsistent biases are resolved.

Inconsistent Biases
Edge Merging

Figure 12:
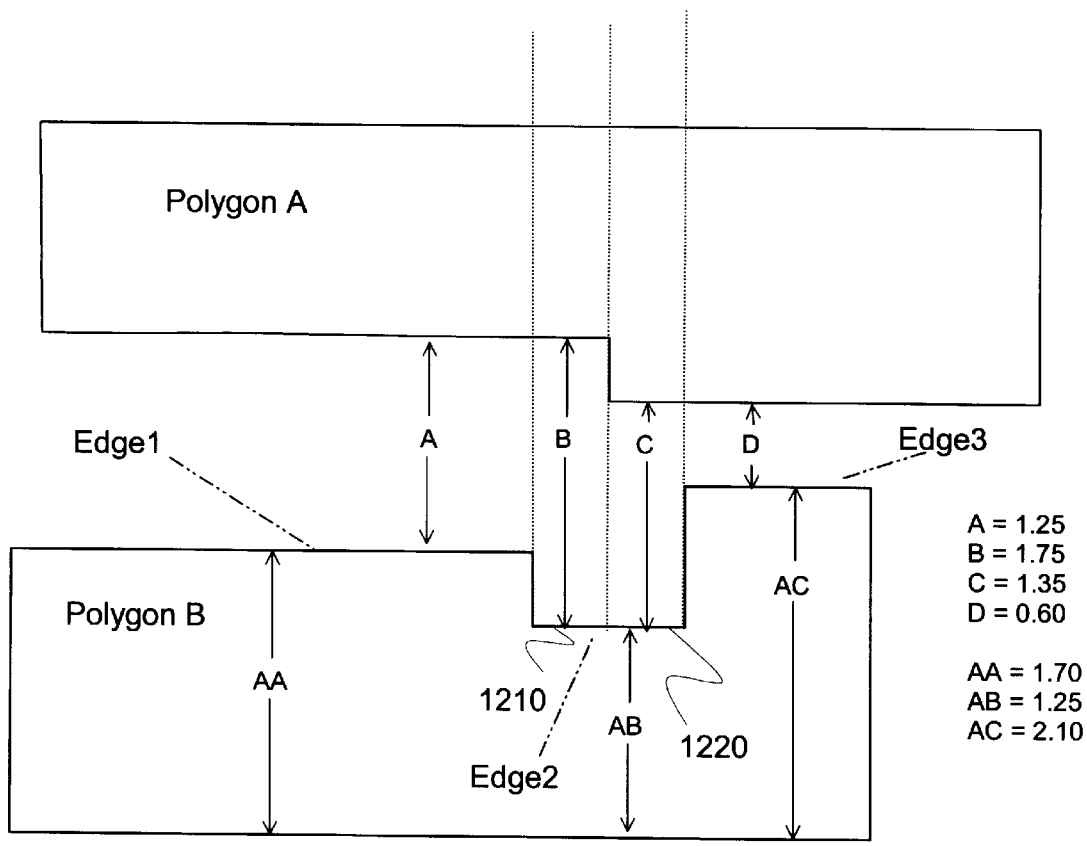
FIG. 12—An example partial layer of polygon showing width and spacing to which an embodiment of this invention may be applied.

Another aspect of the invention is the ability to determine how to resolve adjacent edge segment biases, which may be inconsistent or even conflicting. For example, when two edge segments are to be biased, which bias measurement, if any, should an algorithm apply to prohibit the introduction of additional short edges? FIG. 12 shows a layer with polygons upon which one embodiment of the present invention operates. The figure also shows measurements of varying widths of polygon B (AA-AC). Additionally, FIG. 12 shows the spacing at different points between polygons A and B (A-D).

Figure 13:
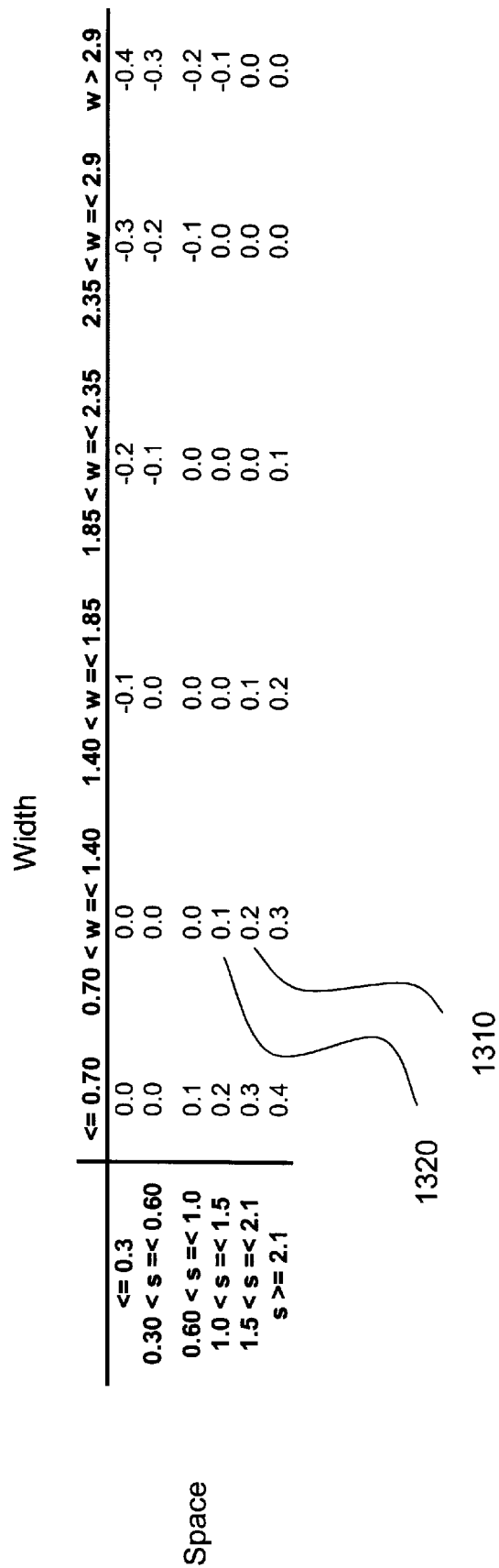
FIG. 13—A 2-dimensional table of correction, in accordance with one embodiment, to be applied to the example partial layer polygon of FIG. 12.
Figure 14:
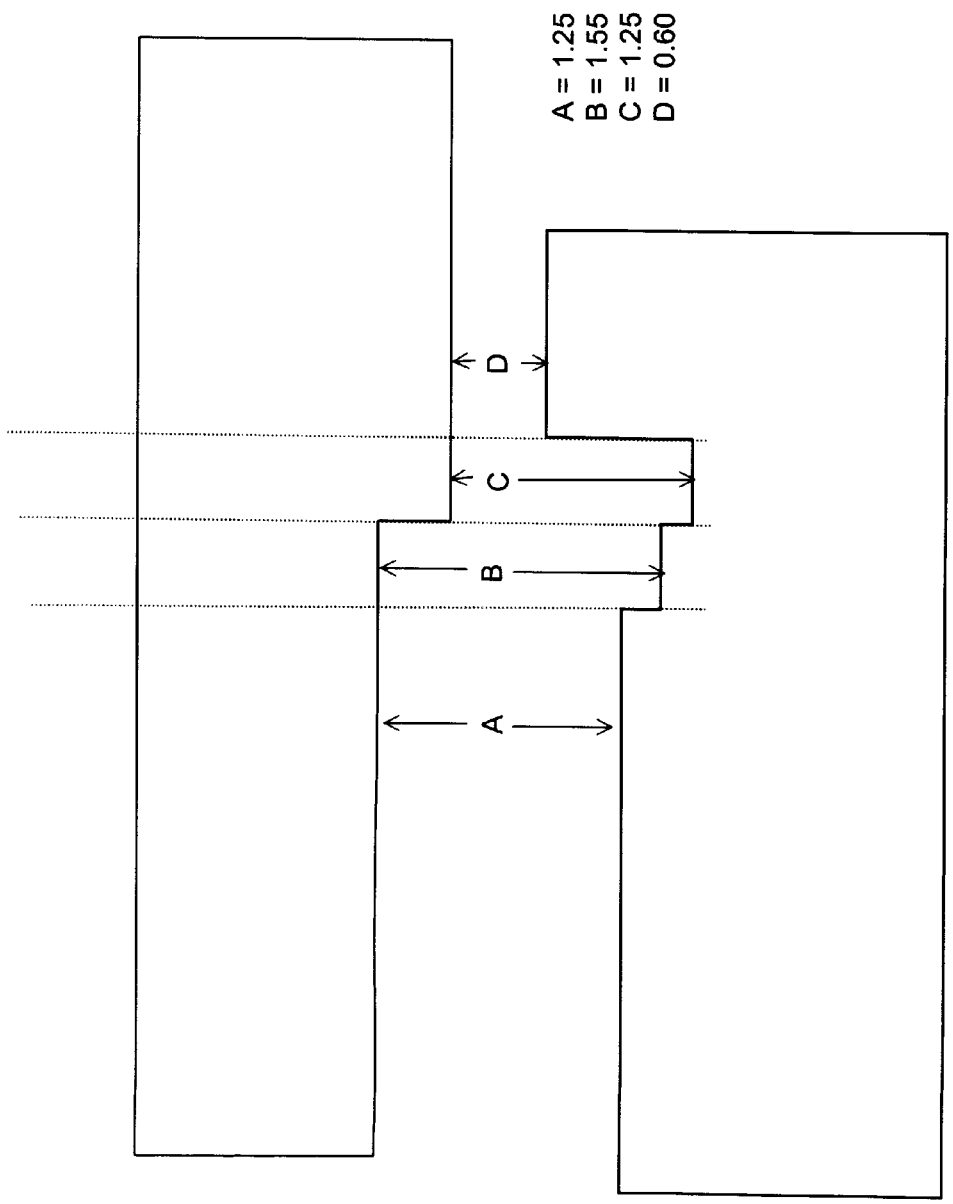
FIG. 14—The resulting polygon from the application of the table of correction of FIG. 13 to the example partial layer polygon of FIG. 12.

FIG. 13 shows a chart with the bias values that the present embodiment of the invention will apply to an edge segment. Space B and width AB define edge segment 1210. Space C and width AB define edge segment 1220. Edge2 is therefore comprised of 2 edge segments 1210 and 1220. Looking for the appropriate bias values for the B/AB space/width combination in FIG. 13, it is determined that the bias 1310 for edge segment 1210 is 0.2. In contrast, by looking up C/AB in FIG. 13 it is determined that the bias for edge segment 1220 is 0.1. This separate application of different biases to edge segments 1210 and 1220 results in an additional edge being created, one for each biased edge segment, as shown in FIG. 14. The addition of too many extra edges during processing is undesired behavior.

Figure 15:
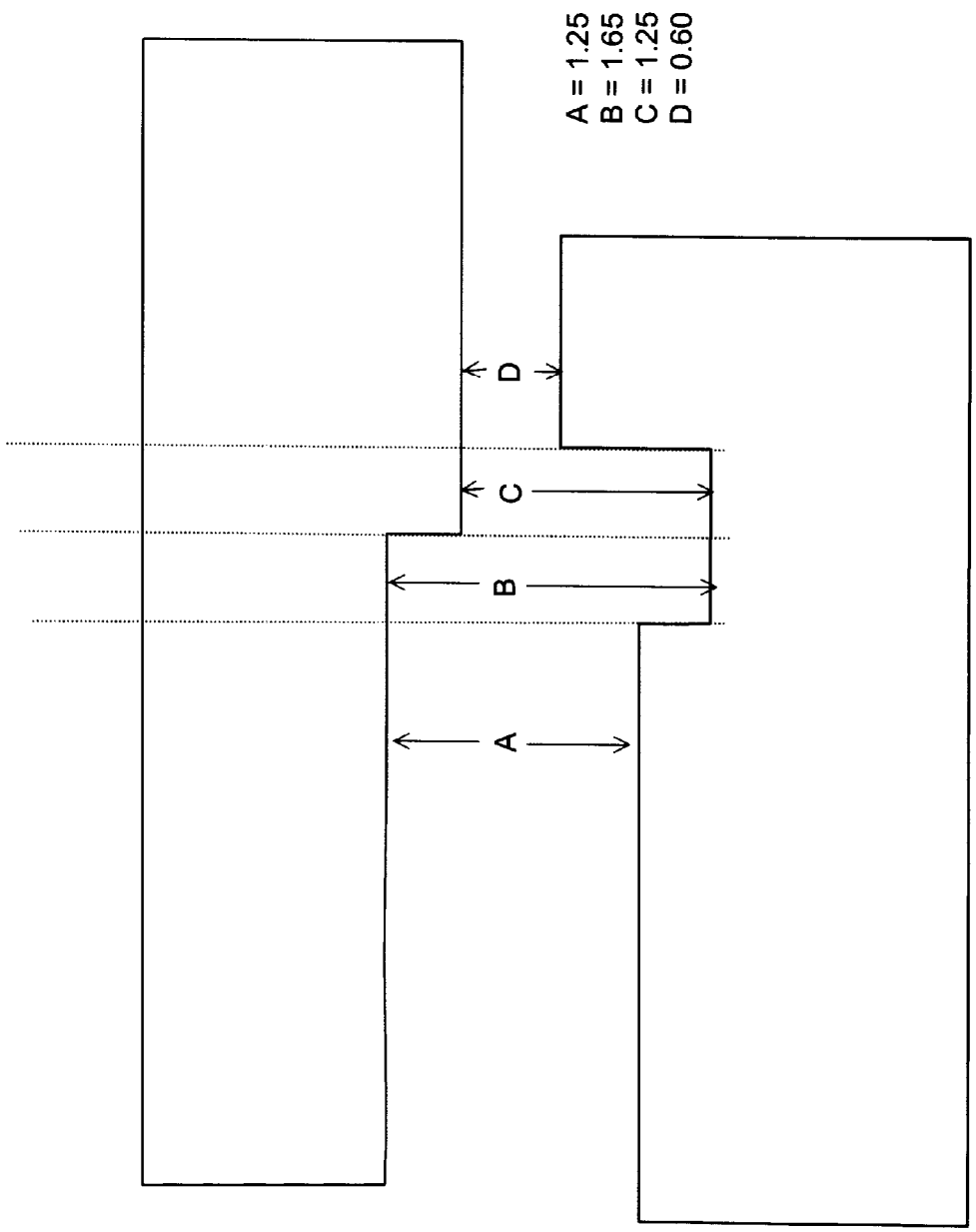
FIG. 15—Resulting polygon from a space-priority based bias.

Thus, when two biases for adjacent edge segments differ, various embodiments of the present invention apply a resolution function to determine the correct bias value to be employed, to avoid introduction of additional edges. This resolution may be performed based on any number of criteria. One embodiment of the present invention implements a priority scheme wherein a "maximizing spacing" scheme attempts to apply biases wherein a space-attribute bias determination assumes priority over a width-attribute bias determination. For example, refer again to FIG. 12, where original spacing at C is 1.35 and the spacing at B is 1.75. Applying each of the two possible biases from the table of FIG. 13 to both 1210 and 1220 results in spacing values of 1.65 and 1.35 for B and C, respectively, in the case of a 0.1 bias, and 1.55 and 1.25 for B and C in the case of the 0.2 bias. Thus, applying the 0.1 bias value results in the maximization of the spacing for both B and C. Accordingly, in the embodiment of the invention with a "maximizing spacing" resolution, the 0.1 bias value is applied, resulting in the corrected polygon of FIG. 15.

In another embodiment of the present invention, the user may specify the method of determining the resolution; In yet another embodiment of the present invention, rules associated with the process used for the IC fabrication are used to determine what the resolution function will be.

A situation may arise where the weighing of both biases results in a "tie" as determined by the method of the embodiment. In this case, other application dependent heuristics may be employed for tie breaking. These may include choosing a weighted bias or user specified tie breaking rules.

Edge Lengthening

Another option for resolving the occurrence of short edges is to attempt to lengthen edge segment corrections. In one embodiment of the invention, the length of an edge segment is checked against a minimum edge segment length. If the embodiment determines that the edge segment does not meet the minimum segment length, the embodiment will check adjacent edge segments to determine their length. If the embodiment establishes that there is sufficient length in the short edge segment and the adjacent edge segment combined such that length can be removed from the adjacent edge segment and added to the short edge segment, resulting in two edge segments that meet the minimum length requirements, then the edge segments are so modified.

Figure 16:
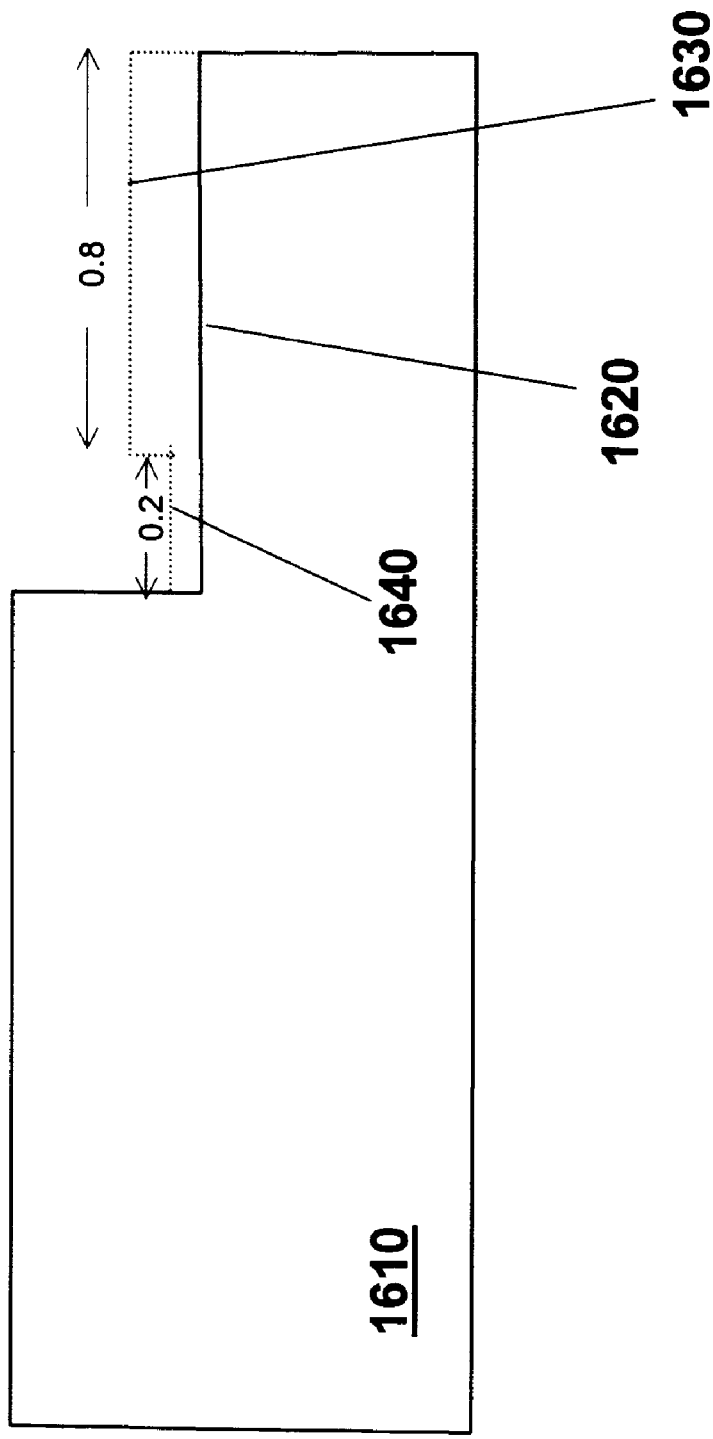
FIG. 16—Example violation of minimum edge length during rule based OPC correction.

Refer now to FIG. 16 wherein an example of an edge-lengthening situation appears. In this embodiment, a polygon exists 1610 where an original edge 1620 has modifications based on requirements as previous discussed. Based on criteria, the two edge segments, edge seg1 1630 and edge seg2 1640 are to replace the original edge 1620. This embodiment of the invention has a minimum segment length of 0.4. However, the edge seg2 1640 has a length of 0.2 and is shorter than the minimum segment length of 0.4. In this embodiment of the invention, the adjacent segment edge seg1 1630 will be checked. This segment has a length of 0.8. As a result, it is possible to modify the length of edge seg2 1640 to meet the minimum requirement of 0.4 by taking length from edge seg1 1630.

Figure 17:
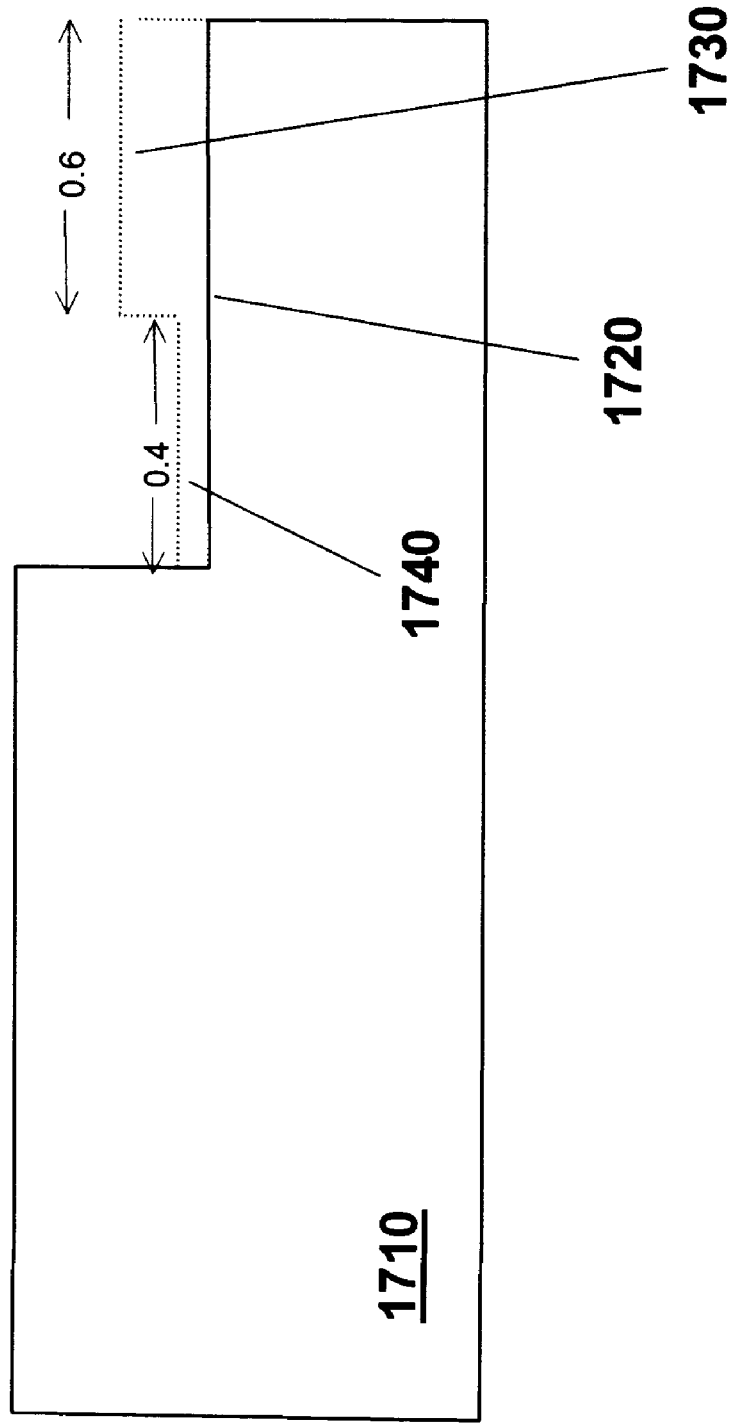
FIG. 17—Results of applying short edge corrections to rule based OPC.

The resulting corrections are shown in FIG. 17. In this figure, edge seg2 1740 has been extended to meet the minimum length requirement of 0.4. There is a shorter edge seg1 1730 reflected in the modifications made to allow edge seg2 to meet the minimum requirements.

In one embodiment of this invention, only part of the requirement addition to an edge segment is taken from a single edge. This results in a short edge that does not meet the minimum requirement, but is nevertheless closer than the original. In one embodiment of the present invention, a short edge is between to other edge segments. In this embodiment "length" is taken from two adjacent edge segments when an edge segment does not meet a minimum length requirement.

User Device Embodiment

Hardware

Figure 18:
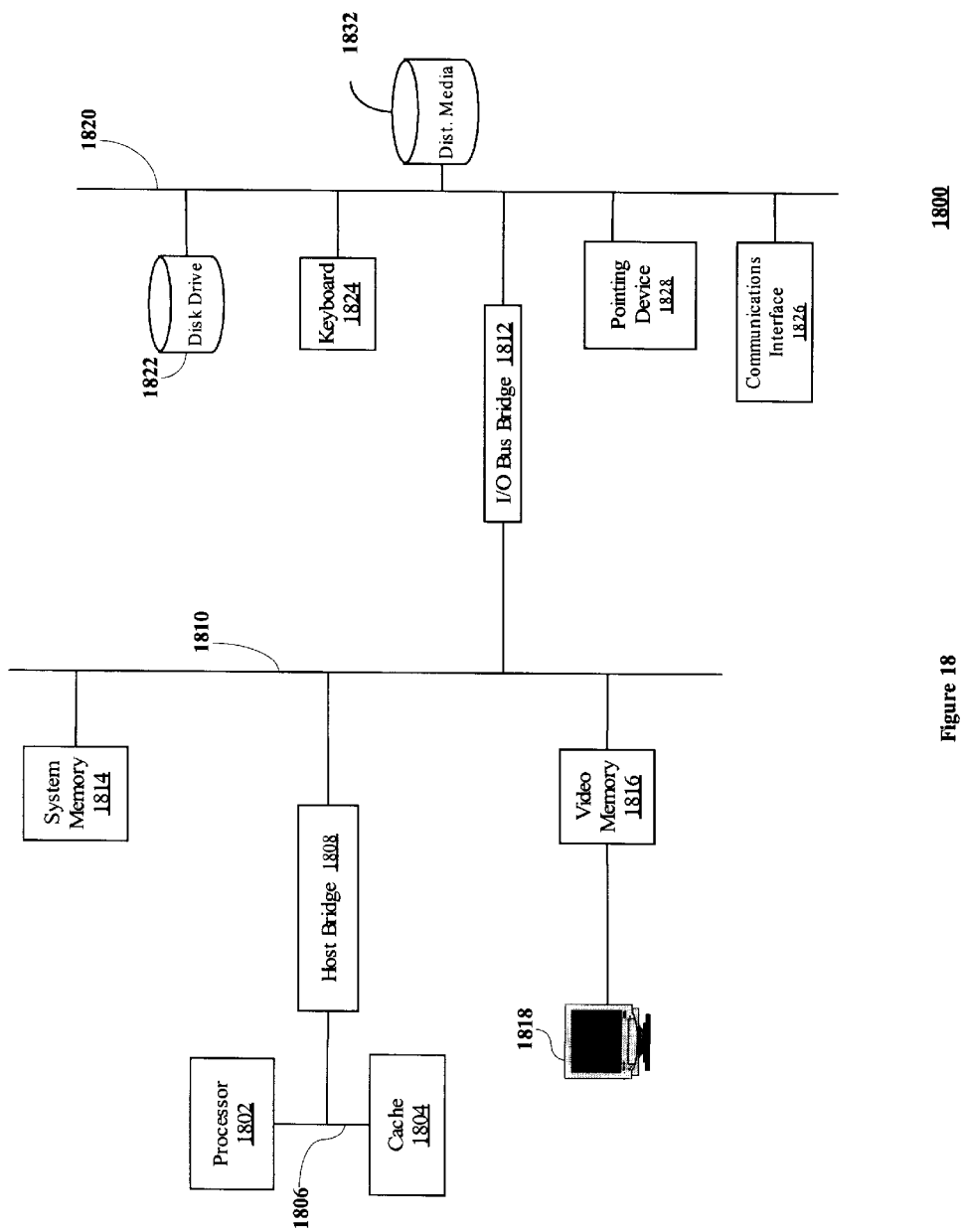
FIG. 18—An example computer incorporated with an embodiment of the present invention.

FIG. 18 illustrates one embodiment of a user apparatus suitable to be programmed with the utility application of the present invention. As shown, for the illustrated embodiment, user device 1800 includes processor 1802, processor bus 1806, high performance I/O bus 1810 and standard I/O bus 1820. Processor bus 1806 and high performance I/O bus 1810 are bridged by host bridge 1808, whereas I/O buses 1810 and 1820 are bridged by I/O bus bridge 1812. Coupled to processor bus 1806 is cache 1804. Coupled to high performance I/O bus 1810 are system memory 1814 and video memory 1816, against which video display 1818 is coupled. Coupled to standard I/O bus 1820 are disk drive 1822, keyboard 1824 and pointing device 1828, and communication interface 1826.

These elements perform their conventional functions known in the art. In particular, disk drive 1822 and system memory 1814 are used to store permanent and working copies of the electronic design system. The permanent copy may be pre-loaded into disk drive 1822 in factory, loaded from distribution medium 1832, or down loaded from a remote distribution source (not shown). Distribution medium 1832 may be a tape, a CD, a DVD or other storage medium of the like. The constitutions of these elements are known. Any one of a number of implementations of these elements known in the art may be used to form computer system 1800.

Certain embodiments may include additional components, may not require all of the above components, or may combine one or more components. Those skilled in the art will be familiar with a variety of alternative implementations.

EDA Tool Suite

Refer now to FIG. 19 wherein an EDA tool suite incorporated with a "Short edge management in rule based OPC" module of the present invention in accordance with one embodiment is shown. As illustrated, EDA tool suite 1900 includes OPC module 1902 incorporated with the teachings of the present invention as described earlier with respect to FIGS. 1–17. Additionally, EDA tool suite 1900 includes other tool modules 1904. Examples of these other tool modules 1904 include but are not limited to synthesis module, DRC module and LVS module.

Remote Client

Figure 20:
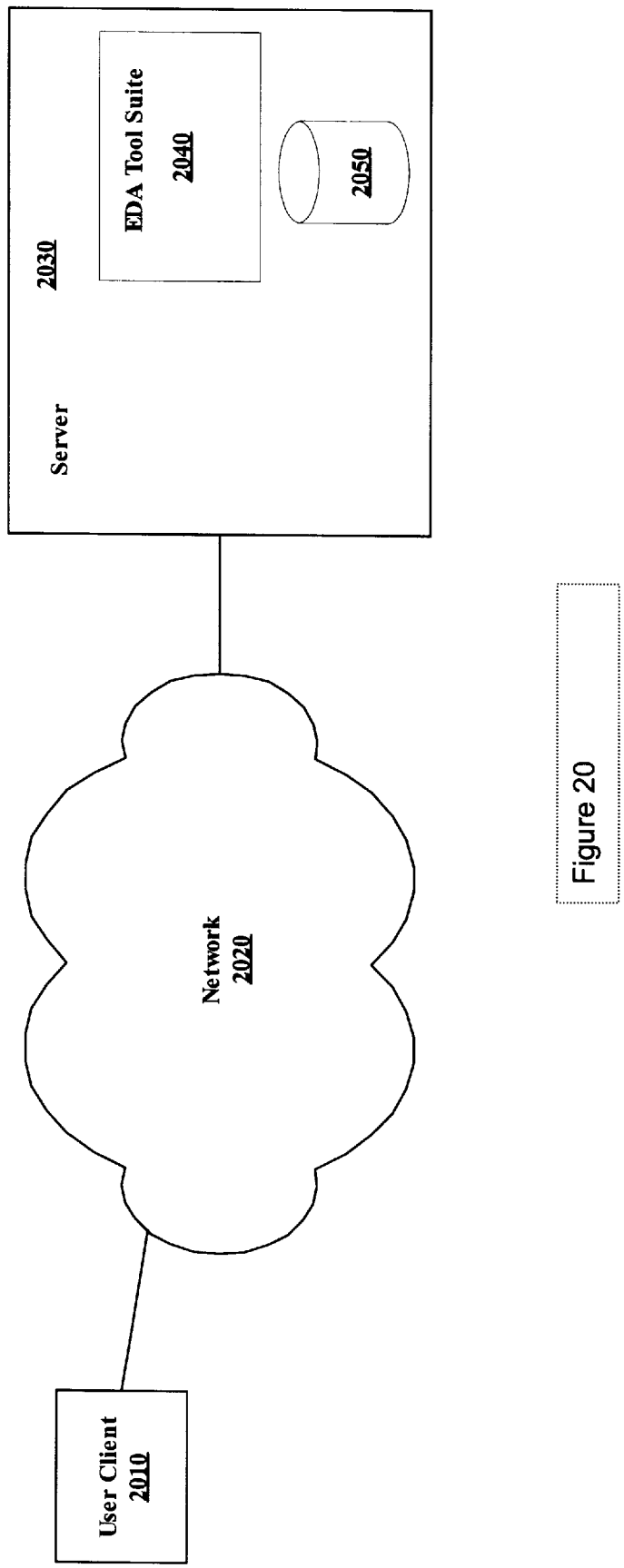
FIG. 20—A networking environment suitable for practicing the invention.

FIG. 20 shows an embodiment of the present invention 2000 with a remote client. In this embodiment, user controls, via a user client 2010, execution of an EDA tool suite 2040 containing a "Short edge management in rule based OPC" module incorporated with the teachings of the present invention. The user interacts with a server 2030 executing the EDA tool suite 2040 through a network 2020. The server 2030 executes the EDA tool suite 2040 which reads the user design data 2050, performs operations on user data 2040 and provides feedback to user via user client 2010. In various other embodiments of the present invention the EDA tool suite, user client and user design data can be distributed amount several network elements.

Conclusion

In the present description, an advantageous method of performing OPC to an IC mask layout as well as a method for managing short edge generation in the layout has been described.

What we claim is:

1. A method of performing process correction at a layer of an integrated circuit design comprising:
   determining a width of a polygon of said layer at an edge segment of said polygon;
   determining a spacing from said edge segment of said polygon to a neighboring feature in said layer;
   determining a length of said edge segment; and
   conditionally modifying said edge segment based at least in part on at least a selected one of said width, said length and said spacing determinations.

2. The method of claim 1 wherein said conditionally modifying said edge segment is based at least in part on exactly one of said width, said length and said spacing determinations.

3. The method of claim 1 wherein said conditionally modifying said edge segment is based at least in part on said length determination.

4. The method of claim 1 wherein said conditionally modifying said edge segment is based at least in part on said length and said spacing determinations.

5. The method of claim 1 wherein said conditionally modifying said edge segment is based at least in part on said length, said width and said spacing determinations.

6. The method of claim 1 wherein said conditional modification of said edge segment comprises a decrease in said width of said edge segment if said width exceeds a reference width value.

7. The method of claim 1 wherein said conditional modification of said edge segment comprises an increase in said width of said edge segment if said spacing exceeds a reference spacing value.

8. The method of claim 1 wherein said conditional modification of said edge segment comprises a decrease in said width of said edge segment if said width exceeds a reference width value and said spacing does not exceed a reference spacing value.

9. The method of claim 1 further comprising
   determining a second length of an edge segment of said neighboring feature; and
   wherein said conditionally modifying said edge segment is based at least in part on at least a selected one of said width, said length, said second length and said spacing determinations.

10. The method of claim 9 wherein said conditionally modifying said edge segment is based on said second edge segment.

11. The method of claim 1 wherein a bucketized approach is utilized.

12. An apparatus comprising:
    a machine readable medium having stored therein a plurality of
       programming instructions designed to operate said apparatus to enable said apparatus to:
          determine a width of a polygon, of a layer of an integrated circuit, at an edge segment of said polygon;
          determine a spacing from said edge segment of said polygon to a neighboring feature in said layer;
          determine a length of said edge segment; and
          conditionally modify said edge segment based at least in part on at least a selected one of said width, said length and said spacing determinations; and
    a processor coupled to said machine readable medium to execute said plurality of programming instructions.

13. The apparatus of claim 12 wherein said programming instructions are modified to conditionally modify said edge segment based at least in part on said length determination.

14. A machine accessible medium having stored therein a plurality of
    programming instructions designed to operate an apparatus to enable said apparatus to:
       determine a width of a polygon, of a layer of an integrated circuit, at an edge segment of said polygon;
       determine a spacing from said edge segment of said polygon to a neighboring feature in said layer;
       determine a length of said edge segment; and
       conditionally modify said edge segment based at least in part on at least a selected one of said width, said length and said spacing determinations.

15. The machine accessible medium of claim 14, wherein said programming instructions are modified to conditionally modify said edge segment based at least in part on said length determination.

* * * * *